United States Patent [19]

Bajor

[11] Patent Number: 4,670,970
[45] Date of Patent: Jun. 9, 1987

[54] METHOD FOR MAKING A PROGRAMMABLE VERTICAL SILICIDE FUSE

[75] Inventor: George Bajor, Melbourne, Fla.

[73] Assignee: Harris Corporation, Melbourne, Fla.

[21] Appl. No.: 722,584

[22] Filed: Apr. 12, 1985

[51] Int. Cl.⁴ .................. H01L 21/385; H01L 21/441
[52] U.S. Cl. ........................... 29/584; 29/590; 29/576 R; 148/188
[58] Field of Search .............. 148/183, 188; 29/589, 29/576 R, 590, 591, 584, 585, 586; 204/192 SP; 365/104, 174

[56] References Cited

U.S. PATENT DOCUMENTS

| | | | |
|---|---|---|---|
| 3,752,702 | 8/1973 | Iizuka et al. | 204/192 SP |
| 3,781,977 | 1/1974 | Hulmes | 29/589 X |
| 4,012,235 | 3/1977 | Mayer et al. | 148/1.5 |
| 4,135,295 | 1/1979 | Price | 29/578 X |
| 4,174,521 | 11/1979 | Neale | 148/1.5 X |
| 4,312,046 | 1/1982 | Taylor | 365/104 |
| 4,376,984 | 3/1983 | Fukushima et al. | 365/174 X |
| 4,403,399 | 9/1983 | Taylor | 29/584 X |
| 4,468,308 | 8/1984 | Scovell et al. | 204/192 SP X |
| 4,518,981 | 5/1985 | Schlupp | 357/71 |
| 4,522,845 | 6/1985 | Powell et al. | 204/192 SP |

*Primary Examiner*—George T. Ozaki
*Attorney, Agent, or Firm*—Thomas N. Twomey; Charles C. Krawczyk

[57] ABSTRACT

The present invention provides an improved method of forming semiconductor fuses involving the use of silicide formation by a low temperature process which avoids heat related damage to other device components and circuitry and which provides better electrical reliability than fuses formed by alternative porcesses. According to the present invention, silicides of noble and refractory metals can be formed by solid phase diffusion to form vertical fuses which are conductive after silicide formation.

19 Claims, 3 Drawing Figures

METHOD FOR MAKING A PROGRAMMABLE VERTICAL SILICIDE FUSE

FIELD OF THE INVENTION

The present invention relates generally to the field of semiconductor fuse elements and more particularly to vertical fuses and even more particularly to the method of forming silicide vertical fuses at relatively low temperatures in solid phase.

The basic concept involved in the operation of a semiconductor fuse is very similar to the typical operation of common fuses in other applications. However, in the semiconductor field, there are two distinct modes of fuse operation. As with common fuses, where the application of current exceeding a predetermined amount causes the fuse element to "blow" thereby creating an open circuit, the first type of semiconductor fuse (generally a horizontal fuse) operates by becoming an open circuit after blowing. More recently, a second category of fuses have become important. These fuses are originally nonconducting and can be rendered conductive by, for example, providing a high voltage to the fuse causing the device to become a short circuit. Certain fuses of this type are commonly referred to as vertical fuses because of the vertical orientation of the operative fusing elements of the fuse. An example of an early vertical fuse is disclosed in U.S. Pat. No. 4,312,046 where the programmable element, i.e. the fuse, is a diode which is vertically shorted by vertical electromigration of atoms from the metallic contact material through the thin layer of insulator into the emitter of the emitter follower. (Lines 50 through 57 of column 2). Since the material transport under electromigration conditions usually takes place in a very narrow path, the metallic contact after fusing effect will be a tiny metallic thread. The existance of this tiny metallic thread as the conducting element in the fuse is of questionable long term stability.

Another example of a prior semiconductor vertical fuse element exists in U.S. Pat. No. 4,174,521 wherein the memory element is based on solid phase epitaxial growth. During programming in this approach the conducting silicide layer which has been previously formed on the single crystal silicon surface and an amorphous or insulating silicon layer which is in contact with the silicide layer are exposed to a high voltage at an electrical temperature solid phase epitaxial growth of a single crystal column through the amorphous silicon layer and in that manner establish an electrical contact.

U.S. Pat. No. 4,012,235 is directed to the solid phase epitaxial growth similar to that described in the above mentioned U.S. Pat. No. 4,174,521.

Of additional interest is U.S. Pat. No. 4,376,984 in which current is applied along a path of a vertical fuse which includes a metal electrode, preferably aluminum, and an N+ type silicon region such that after melting the resulting metal silicon eutectic short is formed across a pn junction. A buffered layer of silicon as shown in FIG. 3 of the '984 patent prevents programming at fabrication temperatures. Additionally, U.S. Pat. No. 3,781,977 discloses a read only memory device wherein aluminum acts as a contact material to short through a reduced area of silicon oxide upon application of an appropriate voltage.

SUMMARY OF THE INVENTION

If a thin layer of metal film is deposited on a silicon surface at an elevated temperature that is significantly lower than the melting temperature of the metal or the silicon or even the melting temperature of the eutectic composition of the metal and silicon, a diffusion process will take place in solid phase. This means that the silicon atoms will migrate (diffuse) into the metal and the metal atoms will migrate (diffuse) into the silicon. This process will go on until the whole metal layer will be completely intermixed with the silicon. Thus, a metal-rich silicide will be formed on the silicon surface. Further heating of the silicon with the metal rich silicide layer on the surface will cause a further migration diffusion of the silicon atoms into the silicide layer until it will be converted into a very stable silicon rich silicide. At that point, the silicide formation is completed and further heat treatment at that temperature will not cause any further change in the silicide layer. The entire heating process described above can be concluded in a mere fraction of a second and the silicide formation which continues for a short time after cessation of heating is concluded in less than one second. Of course, the temperature and thickness of the silicon layer will have an effect on the total time required for the silicide formation.

In the practice of the invention, a refractory or noble metal film is provided on an insulating or semi-insulating silicon layer which silicon layer is between the metal film and a second conductor thus defining a fuse in a nonconducting or (off) state. This fuse can be programmed or "fused" when the silicon layer is rendered electrically conductive by solid phase diffusion of metal into the silicon and silicon into the metal thus establishing a conductive silicide. The creation of a vertical fuse in this manner is a substantial improvement over the use of prior techniques such as electromigration, epitaxial regrowth and melting because the fusing mechanism is simple and the conducting silicide layer after fusing (on state) is very stable.

DETAILED DESCRIPTION OF THE INVENTION

Using a proper silicon film, and a refractory metal to form a film sandwich which serves as a contact on a device, the contact of the present invention can work as an insulator if the sandwich is a Schottky barrier or if the silicon film is amorphous such that it is acting as an insulator. In this arrangement the sandwich forms a fuse element, or switch, which can be rendered conductive by applying a predetermined voltage thus causing current to flow vertically through the contact which results in heating of the sandwich structure at or near the contact area and a conducting refractory silicide will be formed without melting of the metal or silicon, or the silicide itself. This silicide is thermally stable, and can work in a semiconductor circuit as a conductor or a Schottky diode. In operation the vertical fuse element of the present invention utilizes a very small area of the semiconductor device, thus providing advantage over prior nonvertical approaches. Additionally, due to the process used in the formation of the silicide of the invention, it is not necessary that the semiconductor device be heated to the high temperatures previously required for blowing fuses because the silicide formation can occur at temperatures as low as 400° C. in solid phase. The silicide thus formed is a very stable material and is therefore of extremely high reliability. Silicides formed by solid phase as described herein can form either a contact or a diode subsequent to blowing of the fuse.

Figure 1:
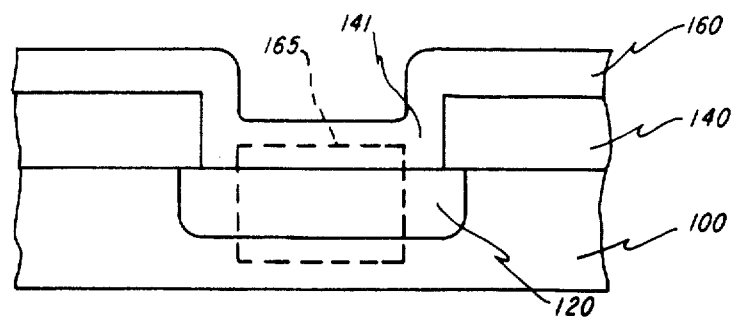
FIG. 1 is a cross section of one embodiment of a silicide vertical fuse made in accordance with the invention.

With reference to FIG. 1, a p-type silicon substrate 100 having an n-well 120 formed therein has an oxide layer 140 thereover. An oxide aperture 141 provides an opening through the oxide 140 to the n-well 120. A layer of a refractory or noble metal 160 is provided over the oxide 140 such that the metal 160 fills the aperture 141 and contacts the n-well 120. Tungsten has been found to be a particularly desirable metal for the layer 160.

The contact between the tungsten 160 and the silicon 120 will not have the characteristics of an open circuit. When the tungsten 160 is negatively biased, the tungsten to silicon junction is a Schottky barrier that is in reverse bias and current does not flow at less than the voltage necessary to overcome the Schottky barrier. Conversely, when the tungsten 160 is positively biased, the tungsten to silicon junction will form a Schottky barrier in the opposite direction.

When the tungsten is provided with a sufficiently large negative bias, the Schottky barrier will break down allowing current to flow across the junction. The current will cause the junction area to become heated and a tungsten silicide will be formed as a result of the diffusion of the tungsten across the junction. The diffusion across the junction occurs at about 600° C. which is substantially lower than the 1410° C. melting temperature of silicon or tungsten's melting temperature of 3410° C. The diffusion continues until the silicide, designated by dashed line 165, has formed an ohmic conductor between the tungsten 160 and the silicon substrate 100. This diffusion is sufficiently completed in less than one second to obtain the advantage of the invention, although there is no disadvantage to providing heat or current for a longer duration.

The following Table shows the silicide forming temperatures of the preferred noble and refractory metals. The silicide forming temperature of the metals shown on the Table, for purposes of this invention, are the approximate minimum temperatures at which silicide will form by solid phase diffusion.

It is noted that desirable results may be obtained in silicide formation if a temperature of not more than 200° C. above the minimum solid phase diffusion silicide forming temperature is attained.

TABLE

| Metal | Solid Phase Diffusion Silicide Forming Temperature (°C.) |
|---|---|
| Platinum | 400–600 |
| Vanadium | 600–1000 |
| Molybdenum | 600–800 |
| Tungsten | 600–800 |
| Titanium | 700–900 |

TABLE-continued

| Metal | Solid Phase Diffusion Silicide Forming Temperature (°C.) |
|---|---|
| Palladium | 400 |

Figure 2:
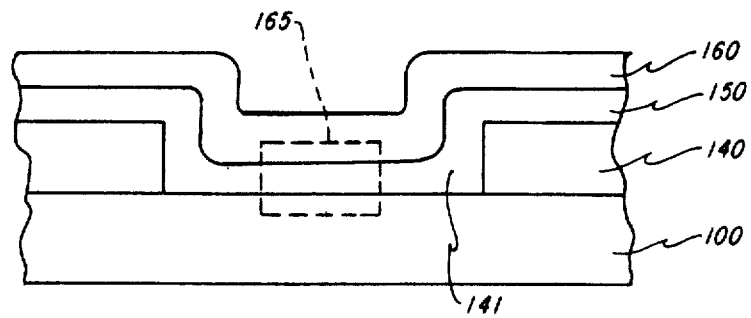
FIG. 2 is a cross section of a second embodiment of a silicide vertical fuse made in accordance with the invention

In the embodiment shown in FIG. 2, an n-type substrate 100 is covered by an oxide 140 having an aperture 141. An insulating or semi-insulating silicon containing layer 150 is provided over the oxide 140 and into the aperture 141 such that the layer 150 is in contact with the substrate 100 at the location of the aperture 141. A layer of a refractory or noble metal 160 is provided over the layer 150 which, for purpose of this example is assumed to be amorphous silicon. It is noted that the significance of an amorphous silicon layer resides in the insulating or semi-insulating nature of this layer and its silicon content. Other insulating or semi-insulating materials such as polycrystalline silicon would be equally satisfactory if the silicon content is sufficient for subsequent silicide formation by solid phase diffusion. For ease of explanation, and by way of example only, the following description refers to tungsten as the metal in layer 160 and amorphous silicon as the material of layer 150. In this structure, the tungsten 160 to silicon substrate 100 contact is insulated by the amorphous silicon layer 150. This structure is thus nonconducting and approximates an open circuit for voltage in a normal operating range of for instance, 5 volts. However, if a sufficiently high voltage is applied across the amorphous silicon layer 150, leakage current through the amorphous silicon layer will cause local heating of the tungsten to silicon contact causing the temperature of the amosphous layer to rise to the silicide forming temperature of about 600° C. Typically, this programming voltage is substantially above the normal operating logic voltage of the fuse-containing electronic circuit and in most cases will be between about 15 and 20 volts. At the elevated temperature, silicon and tungsten atoms will diffuse across the junction and a silicide will form in the fuse region defined by dashed line 165. The silicide will form at a temperature below the melting temperatures of any of the tungsten, the silicon or the silicide itself. This silicide formation is also free of any crystallization or recrystallization phenomena. Once the silicide is formed, the tungsten 160 will be shorted to the substrate 100 by the silicide in fuse region 165. Since the substrate is N-type silicon, the resulting tungsten to substrate junction will have the characteristics of a Schottky diode.

In a variation of the above, if a p-type silicon substrate 100 is provided rather than n-type substrate described, the tungsten 160 to substrate 100 junction through silicide 165 will have the ohmic characteristics described in the embodiment of FIG. 1.

Figure 3:
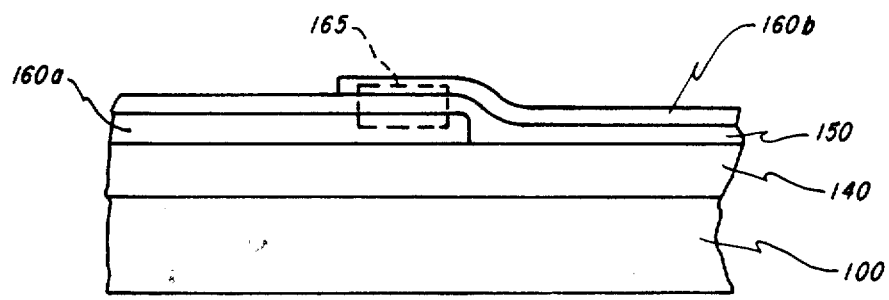
FIG. 3 is a cross section of a third embodiment of a silicide vertical fuse made in accordance with the invention.

A vertical fuse arrangement is shown in FIG. 3, where a substrate 100 has an insulating layer 140 of, for instance, silicon dioxide over which is provided a first conductor 160a of a refractory or noble metal and a second conductor 160b of a refractory or noble metal and an insulating or semi-insulating silicon containing layer 150. As can be seen, the second conductor 160b overlaps the first conductor 160a but is separated, physically and electrically, by layer 150. It is preferred, for optimum performance, that conductors 160a and 160b be of the same material, in this example palladium. Upon application of a significant programming voltage which is above the normal operating voltage for the fuse devices, the silicon layer 150 will become heated to 400° C., the palladium silicide formation temperature, and a conducting silicide will create a short between the two palladium conductors. It is noted that other refractory or noble metals, such as tungsten, will perform well in this type of vertical fuse. Dashed line 165 shows the region which will be converted to a conducting silicide. In a variation of this arrangement, layer 150 may be formed of an n-type polysilicon insulation which will have as insulative property. Upon silicide formation, an electrical short similar to that formed across the amorphous silicon layer will be established. In this way a vertical fuse can be fabricated between two metal interconnects.

The significant benefits of this process are the low temperature silicide formation which will not harm previously formed devices or conductors in the product, the relative simplicity of the fabrication process and the superior characteristics of silicides formed of refractory and noble metals. The selection of refractory and noble metals is a significant factor because with such metals the melting temperature of the silicide is substantially lower than the melting temperature of the metal or of a silicon layer. This facilitates low temperature processing. In addition to the preservation of previously formed devices and conductors, the present invention provides a higher quality, more uniform and more reliable vertical fuse than has been previously available. The present invention is better than aluminum silicide based vertical fuses because refractory and noble silicides are better conductors and are not prone to oxidation. Also, aluminum silicide is brittle and its high coefficient of thermal expansion results in reduced reliability.

With respect to vertical fuses which might be fabricated by an electromigration approach, the present invention provides a more uniform conductor and is thus less subject to the thin wire failures encountered with the electromigration approach. Vertical fuses formed by a eutectic melting approach are electrically inferior and are associated with higher temperatures which increases the risk of damage to other portions of the product.

While the invention has been described with respect to several specific applications it will be readily apparent to those skilled in the art that there are countless applications of this invention and it is my intention that the claims appended here to shall be interpreted consistently with the broadest possible scope for my invention.

What is claimed is:

1. A method of forming a vertical silicide fuse comprising the steps of:
   a. providing a substrate having a conductive portion,
   b. providing an insulating layer of silicon containing material over at least said portion of said substrate,
   c. providing a fuse-metal layer over at least a portion of said insulating layer, said fuse-metal being selected from the group consisting of noble and refractory metals,
   d. whereby said vertical silicide fuse can be fused by heating said insulating layer to a temperature below the melting temperature of all of said insulating layer, said fuse-metal, said substrate and a silicide of said fuse-metal, to form by solid phase diffusion a silicide of said fuse-metal.

2. A method as claimed in claim 1 wherein said insulating layer comprises amorphous silicon.

3. A method as claimed in claim 1 wherein said fuse-metal is tungsten.

4. A method as claimed in claim 3 wherein the heating of said insulating layer is to a temperature of between about 600° C. and 800° C.

5. A method as claimed in claim 4 wherein said insulating layer comprises amorphous silicon.

6. A method as claimed in claim 1 wherein said silicide is formed without melting and without solid phase epitaxial growth.

7. A method as claimed in claim 1 wherein heating of said insulating layer is accomplished by establishing a programming voltage across said insulating layer.

8. A method of forming a vertical silicide fuse comprising the steps of providing a layer of an electrically conducting metal selected from the the group consisting of noble and refractory metals, on a silicon containing structure, whereby said vertical silicide fuse can be fused by forming a silicide of said metal by solid phase diffusion of said metal into said silicon containing structure and by solid phase diffusion of silicon into said metal layer by elevating the temperature of the metal and silicon to the silicide forming temperature of said metal by establishing a programming voltage between said metal and said silicon containing structure.

9. A process for forming a vertical silicide fuse comprising the steps of creating a junction region where a metal selected from the group consisting of the noble and refractory metals is adjacent a layer of silicon containing material and applying a current through said silicon containing material to heat said material to a silicide forming temperature below the melting temperature of said material such that metal atoms diffuse across junction region without epitaxial re-growth and without melting the metal and without melting said silicon containing material.

10. A method of forming a vertical silicide fuse comprising,
   a. providing a first layer of a metal selected from the group consisting of noble and refractory metals,
   b. providing a second layer of n-type crystalline silicon,
   c. providing a third layer of undoped crystalline silicon, such that said second layer is intermediate and adjacent said first and third layers,
   d. said first and second layers being in contact at a fuse region such that a Schottky barrier is formed which prevents current flow at voltages below the breakdown voltage of the Schottky barrier prior to fuse and,
   e. whereby said vertical silicide fuse can be fused by heating said fuse region to cause solid phase diffusion of said metal completely through said second layer and to cause solid phase diffusion of said silicon into said metal to thereby form a metal silicide without melting of any of said metal, said silicon or said metal silicide, thereby establishing an ohmic contact between said first and third layers.

11. A method as claimed in claim 10 wherein said fuse region is heated for a period of less than one second to not more than 200° C. above the minimum solid phase diffusion silicide forming temperature for said metal.

12. A method of forming a vertical silicide fuse comprising,
   providing first and second metal layers and a silicon containing layer having a substantial insulating characteristic said first metal layer being formed of a metal selected from the group consisting of the noble and refractory metals, said silicon containing layer being between said first and second metal layers such that there is initially a substantial insulator between said first and second metal layers, whereby said vertical silicide fuse can be fused by heating said silicon containing layer between said first and second metal layers to induce solid phase diffusion of at least said first metal into said silicon containing layer to form a conducting silicide between said first and second metal layers.

13. A method as claimed in claim 12 wherein said first metal layer is a thin metal conductor.

14. A method as claimed in claim 13 wherein said second metal layer is a thin metal conductor and said silicon containing layer is of substantially pure amorphous silicon.

15. A method as claimed in claim 14 wherein said second metal layer is of a metal selected from the group consisting of the noble and refractory metals.

16. A method as claimed in claim 14 wherein said first and second metal layers are of Tungsten.

17. A method as claimed in claim 12 wherein said silicon containing layer is locally heated between said first and second metal layers.

18. A method as claimed in claim 17 wherein said local heating is accomplished by providing a programming voltage between said first and second metal layers.

19. A method of forming a vertical silicide fuse comprising,
 a. providing a first layer of n-type crystalline silicon,
 b. providing a second layer of an insulative silicon containing material,
 c. providing a third layer of a metal selected from the group consisting of the noble and refractory metals,
 d. positioning said second layer intermediate and adjacent said first and third layers,
 e. whereby said vertical silicide fuse can be fused by heating said second layer to a silicide forming temperature without melting any of said first, second or third layers, to form a silicide of said metal by solid phase diffusion, and thereby establish a Schottky diode at the junction of said silicide and said first layer.

* * * * *